(12) United States Patent
Imori (10) Patent No.: US 7,880,301 B2
(45) Date of Patent: Feb. 1, 2011

(54) SEMICONDUCTOR DEVICE AND METHOD FOR MANUFACTURING THE SAME

(75) Inventor: Yoshihisa Imori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 561 days.

(21) Appl. No.: 11/902,217

(22) Filed: Sep. 20, 2007

(65) Prior Publication Data

US 2008/0073780 A1 Mar. 27, 2008

(30) Foreign Application Priority Data

Sep. 21, 2006 (JP) ............................ P2006-255755

(51) Int. Cl.
*H01L 23/48* (2006.01)

(52) U.S. Cl. .................................... 257/739

(58) Field of Classification Search ............... None
See application file for complete search history.

(56) References Cited

U.S. PATENT DOCUMENTS

| 5,804,881 | A  * | 9/1998  | Wille et al. ................. 257/780 |
| 5,919,329 | A  * | 7/1999  | Banks et al. ................ 156/281 |
| 6,011,301 | A  * | 1/2000  | Chiu .......................... 257/678 |
| 6,083,819 | A  * | 7/2000  | Wille et al. ................. 438/612 |
| 6,201,192 | B1 * | 3/2001  | Wille et al. ................. 174/255 |
| 6,214,643 | B1 * | 4/2001  | Chiu .......................... 438/108 |
| 6,246,124 | B1 * | 6/2001  | Jimarez et al. .............. 257/790 |
| 6,288,451 | B1 * | 9/2001  | Tsao .......................... 257/778 |
| 6,744,122 | B1 * | 6/2004  | Hashimoto .................. 257/668 |
| 6,838,299 | B2   | 1/2005  | Mulligan et al. |
| 7,064,452 | B2 * | 6/2006  | Huang et al. ................ 257/787 |
| 7,067,358 | B2 * | 6/2006  | Chen-Tung et al. ......... 438/127 |
| 7,122,893 | B2 * | 10/2006 | Weng et al. ................. 257/730 |
| 7,329,951 | B2 * | 2/2008  | Daubenspeck et al. ...... 257/737 |
| 7,413,927 | B1 * | 8/2008  | Patwardhan et al. ........ 438/108 |
| 7,417,326 | B2 * | 8/2008  | Ikumo et al. ................ 257/781 |
| 7,476,955 | B2 * | 1/2009  | Street et al. ................. 257/434 |
| 7,491,570 | B2 * | 2/2009  | Street et al. ................. 438/64 |
| 2001/0026959 | A1 * | 10/2001 | Jimarez et al. ............ 438/126 |
| 2004/0077129 | A1 * | 4/2004  | Smith et al. ................ 438/118 |
| 2005/0051885 | A1 * | 3/2005  | Weng et al. ................ 257/687 |
| 2005/0093178 | A1 * | 5/2005  | Huang et al. ............... 257/787 |
| 2005/0202650 | A1   | 9/2005  | Imori et al. |
| 2005/0205984 | A1 * | 9/2005  | Chen-Tung et al. ........ 257/687 |
| 2005/0212145 | A1   | 9/2005  | Imoto et al. |
| 2006/0148211 | A1   | 7/2006  | Iwasaki et al. |
| 2006/0178499 | A1 * | 8/2006  | Chern ........................ 528/353 |

(Continued)

FOREIGN PATENT DOCUMENTS

JP 2000-323624 11/2000

(Continued)

*Primary Examiner*—David E Graybill
(74) *Attorney, Agent, or Firm*—Finnegan, Henderson, Farabow, Garrett & Dunner, L.L.P.

(57) ABSTRACT

A semiconductor device includes a semiconductor element including a semiconductor substrate having an element region, a laminated film formed on the semiconductor substrate and including a low dielectric constant insulating film, and a laser-machined groove provided to cut at least the low dielectric constant insulating film. The semiconductor element is connected to a wiring substrate via a bump electrode. An underfill material is filled between the semiconductor element and the wiring substrate. The fillet length Y (mm) of the underfill material satisfies a condition of $Y > -0.233X + 3.5$ (where $X>0$, and $Y>0$) with respect to the width X (μm) of the laser-machined groove.

7 Claims, 11 Drawing Sheets

U.S. PATENT DOCUMENTS

| | | | |
|---|---|---|---|
| 2006/0244139 A1* | 11/2006 | Daubenspeck et al. | 257/737 |
| 2007/0108623 A1* | 5/2007 | Jao | 257/778 |
| 2007/0138635 A1* | 6/2007 | Ikumo et al. | 257/738 |
| 2007/0196956 A1 | 8/2007 | Imoto et al. | |

FOREIGN PATENT DOCUMENTS

| | | | |
|---|---|---|---|
| JP | 2002118208 A * | 4/2002 | |
| JP | 2003324182 A * | 11/2003 | |
| JP | 2005-252196 | 9/2005 | |
| JP | 2006-108489 | 4/2006 | |
| JP | 2006-190779 | 7/2006 | |
| JP | 2007173361 A * | 7/2007 | |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2006-255755, filed on Sep. 21, 2006; the entire contents of which are incorporated herein by reference.

BACKGROUND OF THE INVENTION

1. Field of the Invention

The present invention relates to a semiconductor device and a method for manufacturing the same.

2. Description of the Related Art

A manufacturing process of a semiconductor device is broadly divided into a step of partitioning a semiconductor wafer into a plurality of element regions by a lattice-shaped dicing line and forming an integrated circuit in each of element regions, a step of cutting the semiconductor wafer along the dicing line to section the respective element regions as semiconductor elements (semiconductor chips), and a step of mounting the semiconductor element on a wiring substrate and packaging it.

To cope with the miniaturization and speeding up of the semiconductor element, the application of low dielectric constant insulating film (Low-k film) which is effective in suppressing a wiring delay (RC delay) (suppression of delay especially by reduction in parasitic capacitance C of wiring) to semiconductor element is promoted. As constituent materials of the Low-k film, for example, fluorine-doped silicon oxide (SiOF), carbon-doped silicon oxide (SiOC), organic silica, porous bodies of them and the like are used.

To a cutting step of a semiconductor wafer, blade dicing which cuts the semiconductor wafer by mechanically cutting it by using a diamond blade is generally applied. When the semiconductor wafer using a Low-k film is cut by blade dicing, there is the problem of easily causing film peeling, cracks and the like due to brittleness and low adhesion strength of the Low-k film. Therefore, prior to blade dicing of the semiconductor wafer having the Low-k film, it is proposed to irradiate laser beam along the dicing line partitioning respective element regions to cut the Low-k film (see JP-A2005-252196 (KOKAI), and JP-A 2006-108489 (KOKAI)).

Concerning the mounting structure (package structure) of the semiconductor element, an FC-BGA (Flip Chip-Ball Grid Alley) package having flip-chip connection in which a wiring path of the semiconductor element and the substrate is short in order to exhibit the performance of the semiconductor element sufficiently is known. In FC-BGA package, the structure in which a heat sink is bonded on the semiconductor element is applied, in order to enhance heat release performance from the semiconductor element which is connected on the wiring substrate. A lid for sealing the semiconductor element is allowed to have the function as the heat sink, and this is bonded to the back surface of the semiconductor element.

The lid which is also used as the heat sink is generally composed of a metal material from the viewpoint of heat release performance. When the package structure including the lid is applied to the semiconductor element having the Low-k film, film peeling in a thermal cycle test (TCT) which is an environment life test becomes a problem. Thermal stress at the time of TCT gives tremendous stress to an edge portion (chip edge) of the semiconductor element existing between the substrate and the lid (heat sink), and this causes film peeling from the chip edge. Because the Low-k film has low film strength of itself and low adhesion to other films, there is the problem of easily causing film peeling on TCT.

Concerning film peeling by a machining damage to the Low-k film at the time of dicing, the film peeling is suppressed by reducing a mechanical damage by applying laser machining. However, film peeling due to the Low-k film also occurs by addition of stress to the chip edge based on the package structure, in addition to the mechanical damage at the time of dicing. Film peeling of the Low-k film based on the package structure cannot be sufficiently suppressed by only the preventive measures against film peeling by application of laser machining. Therefore, in order to enhance manufacturing yield and reliability as the final semiconductor package, suppression of film peeling of the Low-k film based on the package structure is required.

SUMMARY OF THE INVENTION

A semiconductor device according to an aspect of the present invention comprises: a semiconductor element including a semiconductor substrate having an element region, a laminated film formed on the semiconductor substrate and having a low dielectric constant insulating film, and a laser-machined groove provided to enclose the element region, cutting at least the low dielectric constant insulating film of the laminated film, and having a width X (μm); a wiring substrate connected to the semiconductor element via a bump electrode; and an underfill material filled between the semiconductor element and the wiring substrate, and having a fillet shape with a fillet length Y (mm), and in that the fillet length Y (mm) of the underfill material satisfies a condition of Y>−0.233X+3.5 (where X>0, and Y>0) with respect to the width X (μm) of the laser-machined groove.

A method for manufacturing a semiconductor device according to an aspect of the present invention comprises: irradiating a laser beam to a semiconductor wafer having a laminated film including a low dielectric constant insulating film, along a dicing region partitioning a plurality of element regions, to form a laser-machined groove cutting at least the low dielectric constant insulating film of the laminated film and having a width X (μm); cutting the semiconductor wafer along the dicing region by using a blade, to produce semiconductor elements by sectioning the plurality of element regions; connecting the semiconductor element to a wiring substrate via a bump electrode; and fixing the semiconductor element with an underfill material filled between the semiconductor element and the wiring substrate, the underfill material having a fillet shape with a fillet length Y (mm), and in that the underfill material is formed with the fillet length Y (mm) satisfying a condition of Y>−0.233X+3.5 (where X>0, and Y>0) with respect to the width X (μm) of the laser-machined groove.

DETAILED DESCRIPTION OF THE INVENTION

Figure 1:
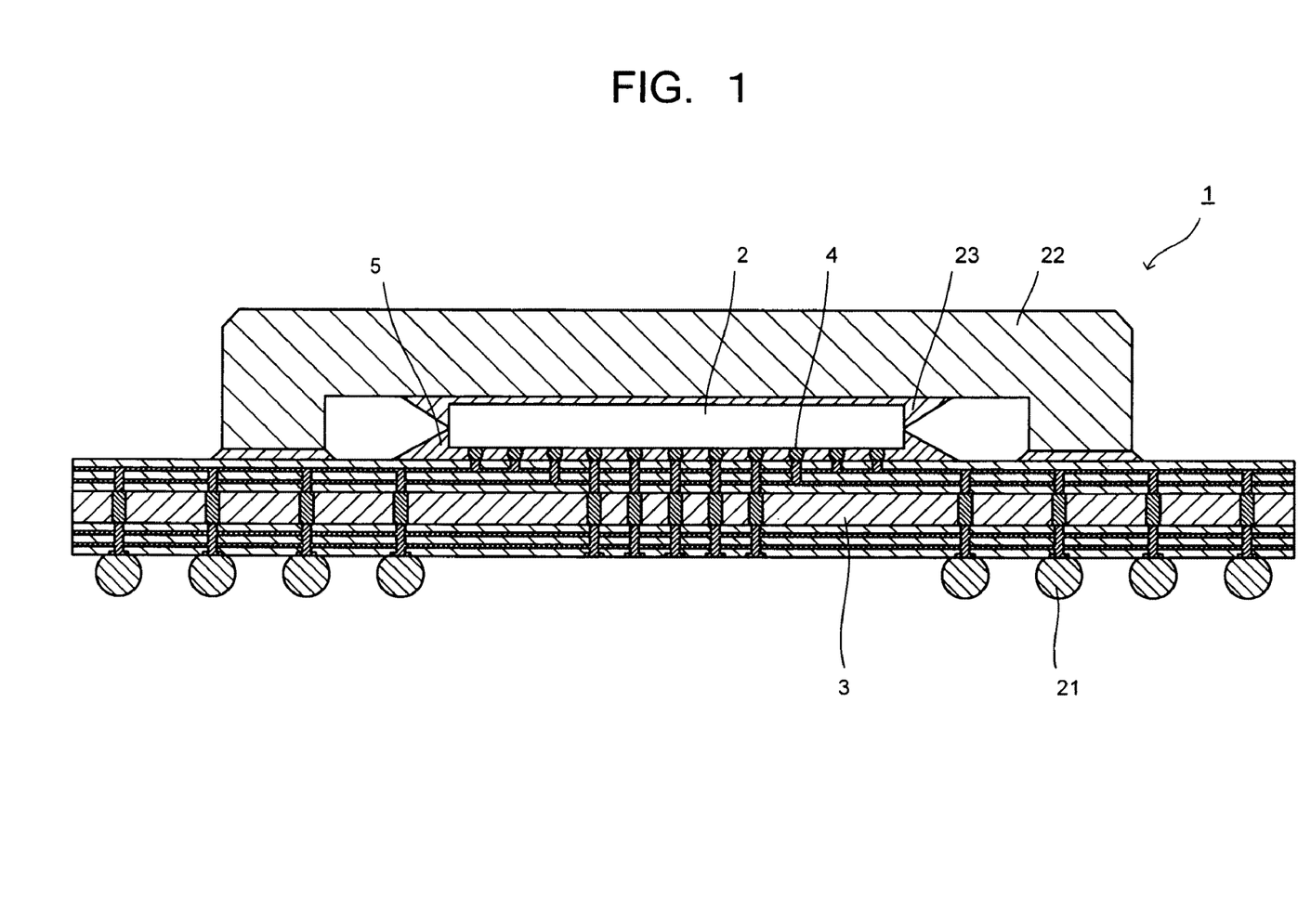
FIG. 1 is a sectional view showing a semiconductor device according to an embodiment of the present invention.
Figure 2:
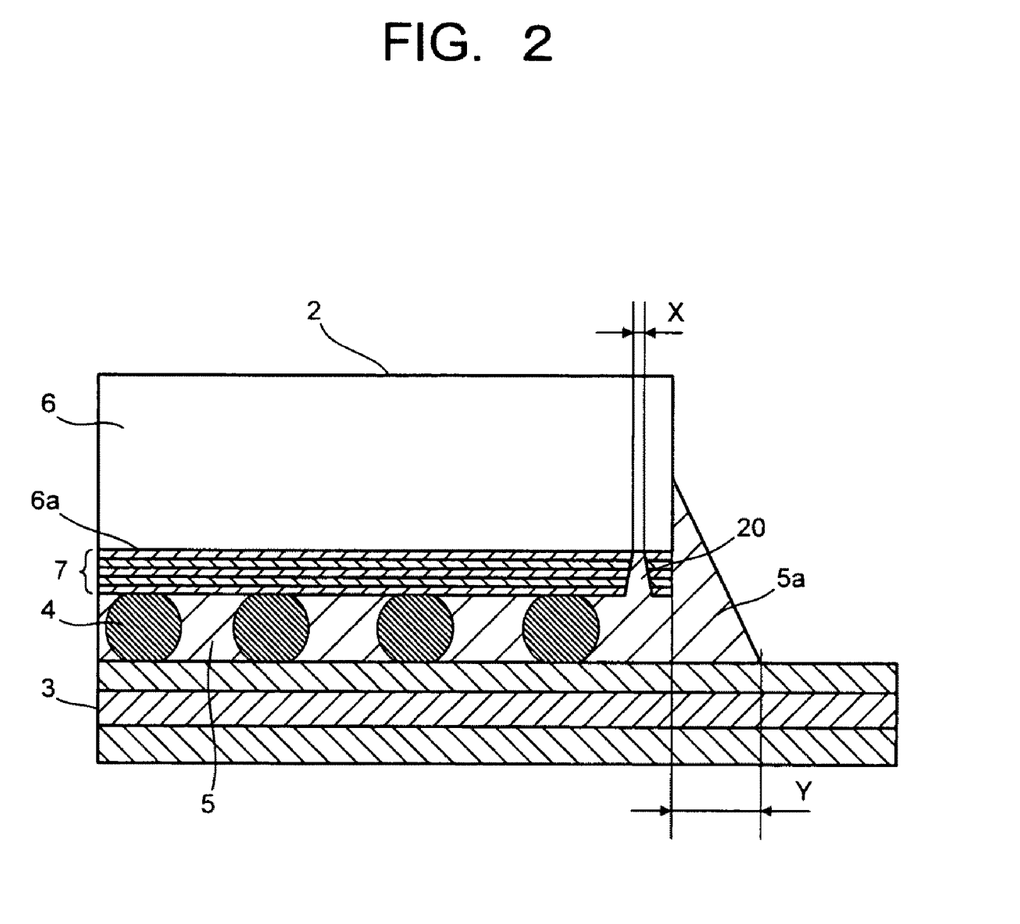
FIG. 2 is a sectional view showing apart of the semiconductor device shown in FIG. 1 by enlarging it.

Hereinafter, a mode for carrying out the present invention will be described with reference to the drawings. FIG. 1 is a sectional view showing an embodiment of a semiconductor package to which a semiconductor device of the present invention is applied, and FIG. 2 is a sectional view showing a part of it by enlarging it. A semiconductor package (semiconductor device) 1 shown in these drawings has a structure of electrically and mechanically connecting a semiconductor element (semiconductor chip) 2 and a wiring substrate 3 with a bump electrode (ball electrode) 4 constituted of a metallic bump such as a solder bump. The semiconductor element 2 is connected to the wiring substrate 3 by flip-chip connection.

The bump electrode 4 is connected to an electrode pad (not illustrated) of the semiconductor element 2 and a connecting pad (not illustrated) provided at a top surface of the wiring substrate 3 respectively. A resin is filled in a gap portion between the semiconductor element 2 and the wiring substrate 3 as an underfill material 5 and solidified. The underfill material 5 has a fillet shape. Namely, the underfill material 5 has a fillet 5a which is formed by the resin filled into the gap portion lying off the outer periphery of the semiconductor element 2 and creeping up the side surface of the semiconductor element 2.

The semiconductor element 2 has an Si substrate 6 as a semiconductor substrate and a laminated film 7 which is formed on a surface of the Si substrate 6. The Si substrate 6 has an element region on which an integrated circuit including a transistor and the like (not illustrated) is formed. The laminated film 7 is formed on a surface 6a of the Si substrate 6 having the element region. The laminated film 7 constitutes a multilayer wiring film, a protection film and the like, and has a low dielectric constant insulating film (Low-k film) as an interlayer insulating film of the multilayer wiring film. The laminated film 7 has a local layer 8, an intermediate layer 9, a semi-global layer 10, a global layer 11 and a passivation layer 12 formed on the Si substrate 6 in sequence as shown in, for example, FIG. 3.

Figure 3:
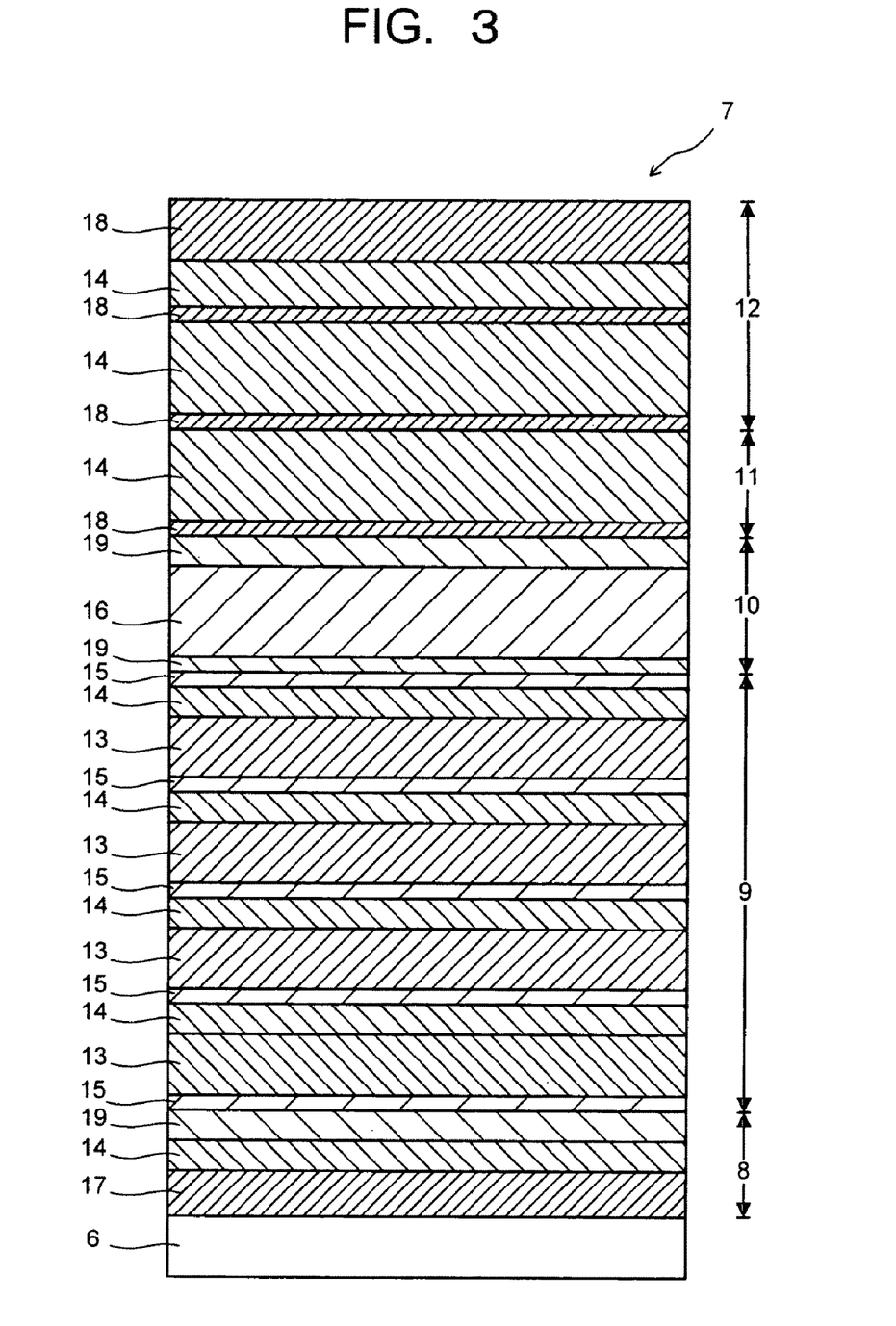
FIG. 3 is a sectional view showing an example of a laminated film of a semiconductor element constituting the semiconductor device shown in FIG. 1.

The intermediate layer 9 has a film structure of a four-layer structure of a low dielectric constant insulating film 13, a $SiO_x$ film 14 such as a TEOS film, and a SiCN film 15. The intermediate layer 9 has a Cu wiring not illustrated in the drawing, and the low dielectric constant insulating film 13 functions as the interlayer insulating film of the Cu wiring. The local layer 8, the semi-global layer 10, the global layer 11, and the passivation layer 12 are constituted of the $SiO_x$ film 14 such as a TEOS film, a fluorine-doped silica glass (FSG) film 16, a non-doped silica glass (NSG) film 17, an $SiN_x$ film 18, an Si film 19 using $SiH_4$, and the like.

A low dielectric constant material having a relative dielectric constant (k value) of 3.3 or less is used for the low dielectric constant insulating film 13. As examples of the low dielectric constant insulating film 13, a fluorine-doped silicon oxide film (SiOF film), a carbon-doped silicon oxide film (SiOC film), an organic-silica film, a HSQ (hydrogen silsesquioxane) film, a MSQ (methyl silsesquioxane) film, a BCB (benzocyclobutene) film, a PAE (polyarylether) film, a PTFE (polytetrafluoroethylene) film, and further porous films thereof are shown.

The laminated film 7 is provided with a groove (laser-machined groove) 20 formed by removing a part of the laminated film 7 with a laser beam to cut at least the low dielectric constant insulating film 13. The laser-machined groove 20 is formed at the outer peripheral side of the semiconductor element 2 to enclose the element region (active area) of the Si substrate 6. By such a laser-machined groove 20, film peeling of the laminated film 7 based on the machining damage of blade dicing, film peeling especially due to the low dielectric constant insulating film 13 is suppressed. The laser-machined groove 20 is preferably formed by being machined to the depth at which the Si substrate 6 is exposed, the depth of, for example, 1 μm or more.

A bottom surface of the laser-machined groove 20 is preferably constituted of the Si substrate 6. Thereby, the laminated film 7 can be completely cut by the laser-machined groove 20. In forming such a laser-machined groove 20 with favorable repeatability, the laser beam is preferably irradiated to machine a part of the Si substrate 6. In securing cutting performance of the laminated film 7, a width X of the laser-machined groove 20 is preferably set at 3 μm on the Si substrate 6. The width X of the laser-machined groove 20 shows the width of the groove bottom surface. In the laser-machined groove 20 in which the bottom surface is constituted of the Si substrate 6, the width X corresponds to the minimum machined width of the Si substrate 6.

In the semiconductor package 1 of the embodiment, the laser-machined groove 20 is allowed to have not only the function of cutting the laminated film 7, but also the function of suppressing film peeling due to the mounting structure of the semiconductor element 2. Therefore, in consideration of a length (fillet length) Y of the fillet 5a of the underfill material 5 as will be described later, the width X of the laser-machined groove 20 is set. As will be described in detail later, thermal stress added to the laminated film 7 is relieved as a result that the underfill material 5 is filled in the laser-machined groove 20 provided at the outer peripheral portion of the semiconductor element 2. Accordingly, film peeling of the laminated film 7 due to the mounting structure of the semiconductor element 2 can be suppressed.

As the underfill material 5 which is filled between the semiconductor element 2 and the wiring substrate 3, for example, an epoxy resin, an acrylic resin, an amine resin, a silicon resin, polyimide resin and the like are used. An underfill resin with a Young's modulus in a range of 5 to 15 GPa and a thermal expansion coefficient in a range of 20 to 40 ppm is especially preferably used.

When the Young's modulus of the underfill resin is less than 5 GPa, there is the fear that stress occurs to the bump electrode 4 which connects the semiconductor element 2 and the wiring substrate 3, and a crack occurs to the bump electrode 4 to break the bump electrode 4. When the Young's modulus exceeds 15 GPa, warpage of the semiconductor element 2 follows the warpage of the wiring substrate 3 and becomes large to be a cause of film peeling from the chip edge. When the thermal expansion coefficient of the underfill resin is less than 20 ppm, it cannot follow the extension of the wiring substrate 3, and becomes the cause of breaking the wiring of the wiring substrate 3. When the thermal expansion coefficient exceeds 40 ppm, the warpage of the semiconductor element 2 follows the warpage of the wiring substrate 3 and becomes large, and becomes the cause of film peeling from the chip edge.

The outer peripheral portion of the underfill material 5 has the fillet shape. The length Y of the fillet 5a of the underfill material 5 is preferably set at 1 mm or more in achieving uniformity or the like of the coating and filling state of the underfill material 5. However, in this case, in consideration of the width X of the laser-machined groove 20 of the semiconductor element 2, the fillet length Y is set. The fillet length Y of the underfill material 5 shows the maximum length of the fillet 5a which lies off the outer peripheral surface of the semiconductor element 2 (length of the bottom portion of the fillet 5a).

For the wiring substrate 3 on which the semiconductor element 2 is mounted, a multilayer wiring substrate to which an insulating substrate such as, for example, a resin substrate, a ceramics substrate, and a glass substrate is applied as the base material is used. As the wiring substrate 3 to which a resin substrate is applied, an ordinary multilayer copper-clad laminate (multilayer printed wiring board) and the like are cited. An external connection terminal 21 constituted of a solder bump or the like is provided at the undersurface side of the wiring substrate 3. The external connection terminal 21 is electrically connected to the semiconductor element 2 via a wiring network by an inner layer wiring and a surface wiring of the bump electrode 4 and the wiring substrate 3.

A vessel-shaped lid 22 is disposed on the wiring substrate 3 to seal the semiconductor element 2. The lid 22 also has the function as the heat sink which releases the heat of the semiconductor element 2 outside the package in addition to the function as the sealing vessel which hermetically seals the semiconductor element 2. Accordingly, the outer peripheral end portions of the lid 22 is hermetically bonded to the wiring substrate 3, and in addition to this, the lid 22 is joined to the back surface of the semiconductor element 2 via, for example, a thermal compound (TIM material) 23. The lid 22 is generally constituted of a metallic material (Cu or the like) excellent in thermal conductivity.

Figure 4:
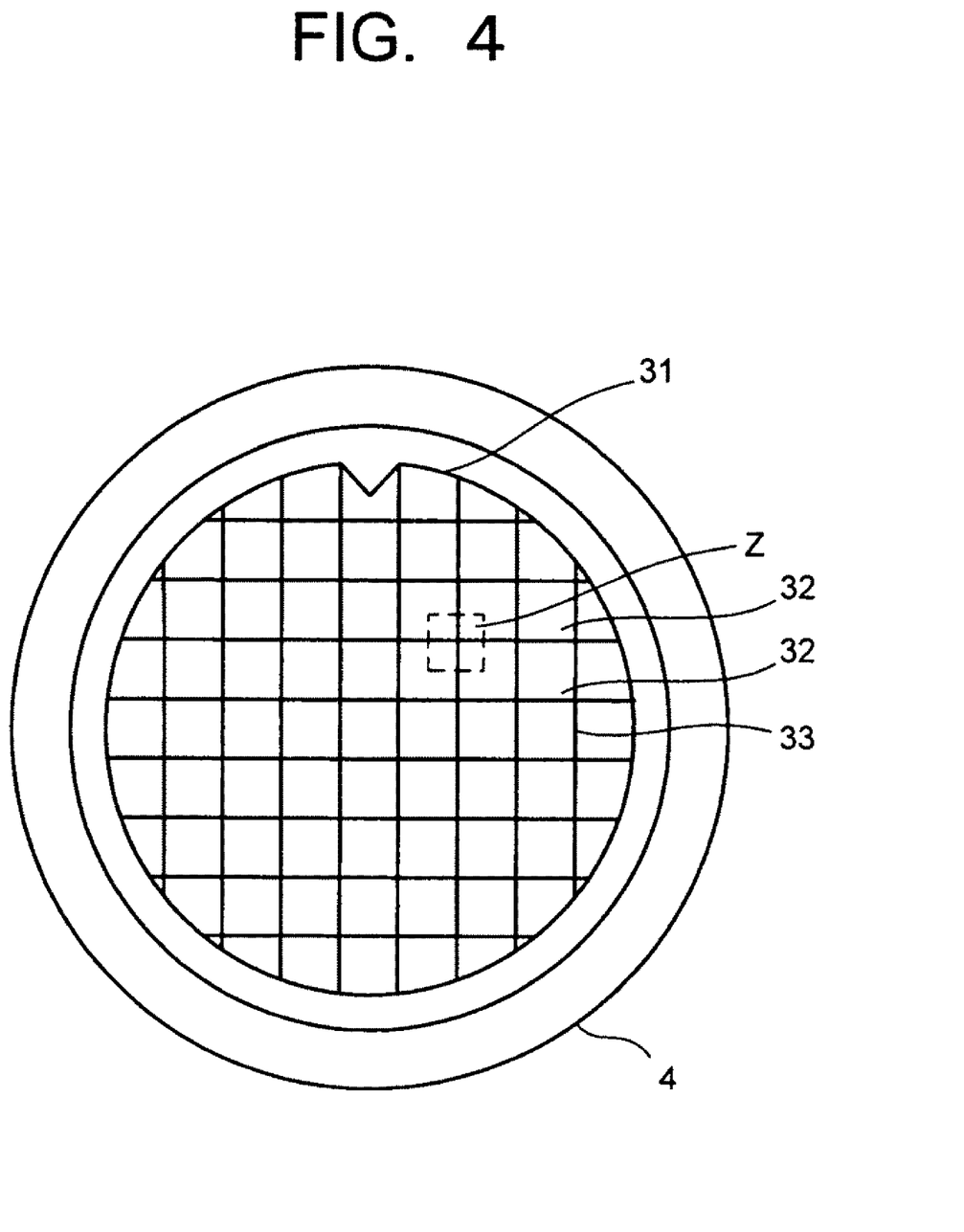
FIG. 4 is a plane view of a semiconductor wafer applied to a manufacturing process of the semiconductor device according to an embodiment of the present invention.
Figure 5:
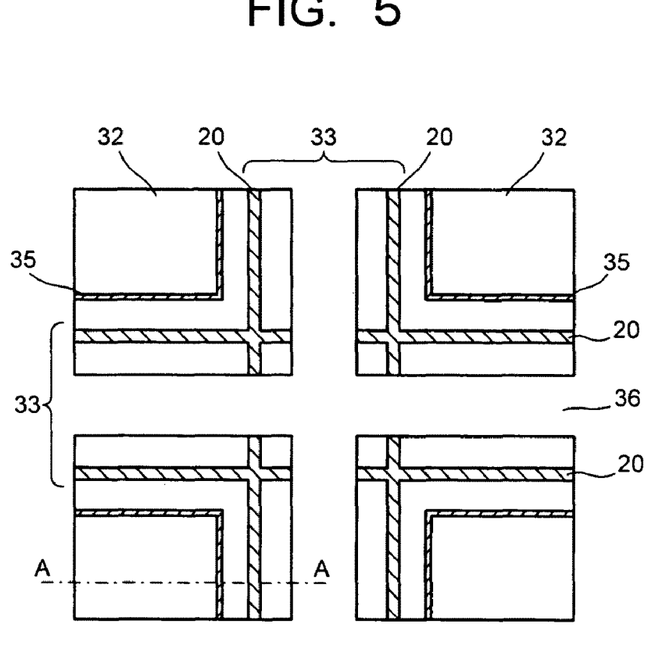
FIG. 5 is a plane view showing a dicing process of the semiconductor wafer shown in FIG. 4.
Figure 6:
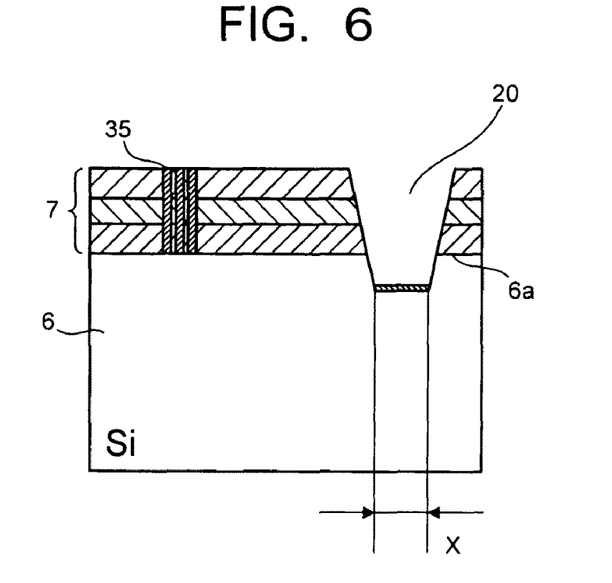
FIG. 6 is a sectional view taken along the line A-A in FIG. 5.

Next, the manufacturing process of the semiconductor package 1 according to the embodiment will be described with reference to FIGS. 4 to 6. FIG. 4 is a plane view showing a constitution of a semiconductor wafer, FIG. 5 is a plane view showing a part of the semiconductor wafer shown in FIG. 4 (a region Z enclosed by the square) by enlarging it, and FIG. 6 is a sectional view taken along the line A to A in FIG. 5. A semiconductor wafer 31 shown in FIGS. 4, 5 and 6 includes a plurality of element regions 32, 32 . . . , and a dicing region (dicing line) 33 provided to be in a lattice shape to partition these element regions 32. Reference numeral 34 denotes a ring frame.

The element region 32 is enclosed by a chip ring 35, and an element structure such as a transistor, various kinds of circuits, wirings and the like are formed in the chip ring 35. The semiconductor element 2 is formed by cutting the semiconductor wafer 31 along the dicing region (dicing line) 33 to section the element regions 32. The element region 32 has the laminated film 7 formed on the surface 6a of the Si substrate 6 as described above. The dicing region 33 is similar to the element region 32 in the sectional structure and has the Si substrate 6 and the laminated film 7.

On dicing the semiconductor wafer 31 having the laminated film 7, a laser beam is first irradiated to the laminated film 7 in the dicing region 33, and a part of the laminated film 7 is removed to form the laser-machined groove 20. The laser beam is irradiated to the portion (dicing region 33) corresponding to the outside of the element region (active area) 32. The laser beam is irradiated along the outer periphery of the chip ring 35. Thereby, the laser-machined groove 20 which cuts the laminated film 7 is formed. The laser-machined groove 20 is formed to enclose the entire outer periphery of each of the element regions 32.

Figure 7:
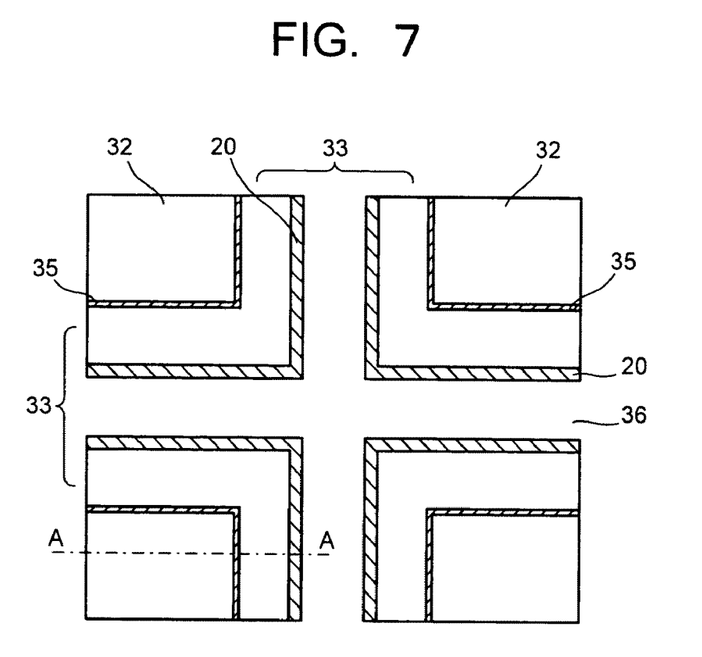
FIG. 7 is a plane view showing another dicing process of the semiconductor wafer shown in FIG. 4.
Figure 8:
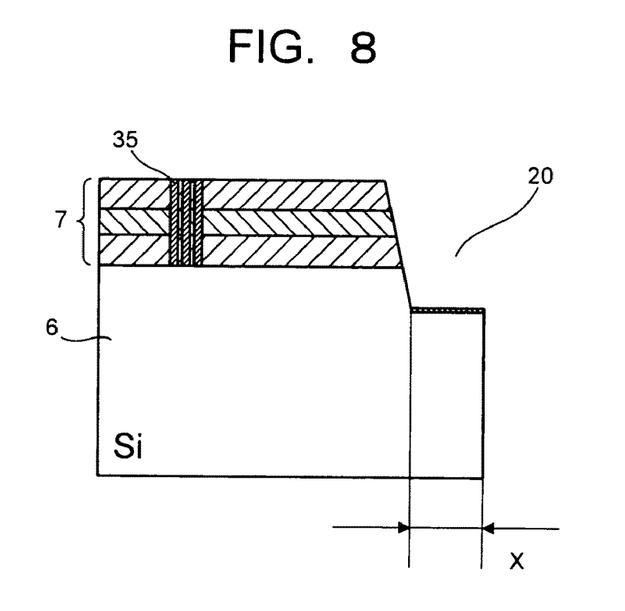
FIG. 8 is a sectional view taken along the line A-A in FIG. 7.

Next, the semiconductor wafer 31 is cut by using a blade. A portion corresponding to an area further outside the laser-machined groove 20 (central portion of the dicing region 33) is cut with a diamond blade or the like, and each of the element regions 32 is sectioned to produce the semiconductor element 2. Reference numeral 36 in the drawing shows a cut portion by the blade. As shown in FIGS. 7 and 8, blade dicing may be applied onto the laser-machined groove 20. By superimposing the laser dicing region and the blade dicing region, the area of the dicing region 33 can be reduced. In any case, the laser-machined groove 20 remains in the outer peripheral portion of the semiconductor element 2 after being segmented.

Next, a solder ball or the like is loaded on the semiconductor element 2 to form the bump electrode 4, and after flux for connection is coated thereon, the bump electrode 4 on the semiconductor element 2 and the wiring substrate 3 are connected by flip-chip connection. The underfill resin is filled in a gap between the semiconductor element 2 and the wiring substrate 3, and is cured to fix the semiconductor element 2 with the underfill material 5. Thereafter, the thermal compound (TIM material) 23 is coated on the back surface of the semiconductor element 2 to joint the lid 22 to it. Finally, solder balls or the like are fitted to the undersurface of the wiring substrate 3 to form the external connection terminal 21, and thereby, the semiconductor package 1 of an FC-BGA structure is produced.

Figure 9:
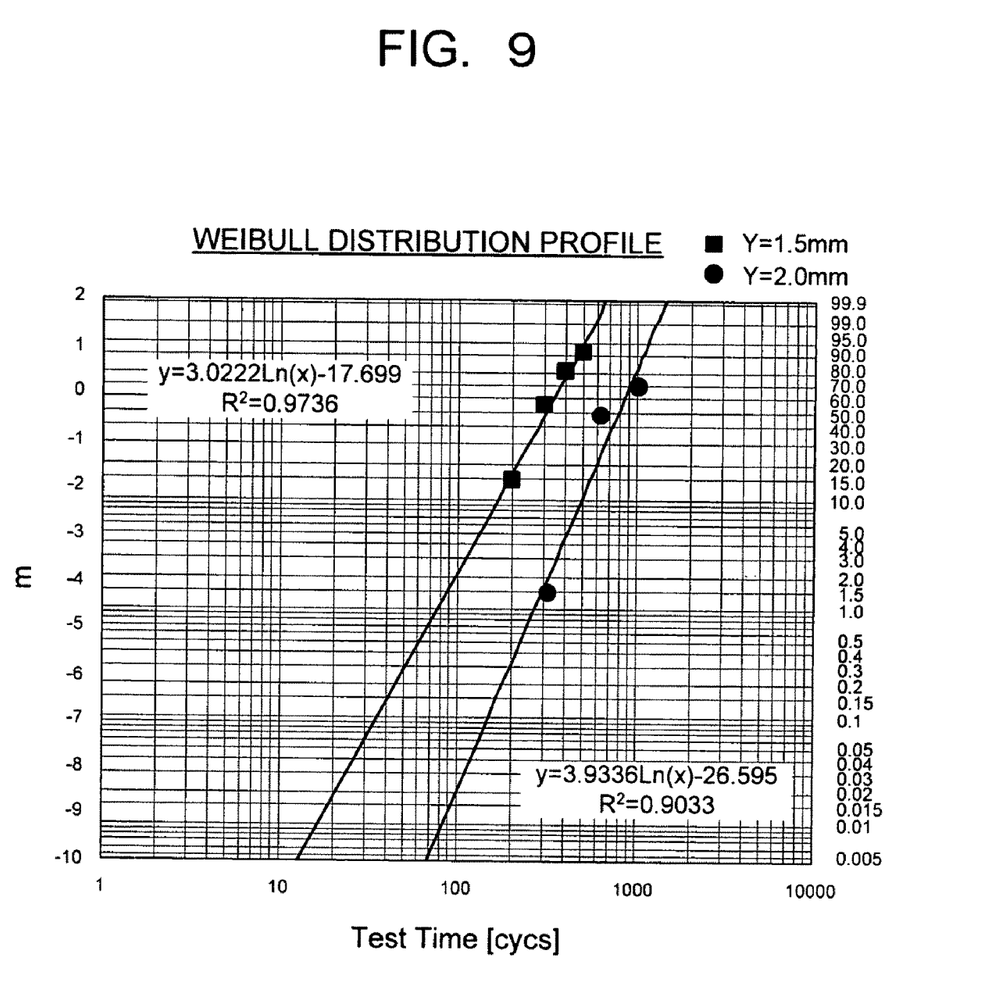
FIG. 9 is a diagram showing an example of a cumulative fraction defective by film peeling after a TCT when a fillet length Y of an underfill material is changed.

In the aforementioned production process, the semiconductor packages 1 with the width X of the laser-machined groove 20 fixed to 5 μm, and the fillet lengths Y of the underfill material 5 set at 1.5 mm and 2.0 mm were produced. The thermal cycle test (TCT) at 125° C. to −55° C. was conducted for these semiconductor packages 1. The cumulative fraction defective due to film peeling of the chip edge after the TCT is shown in FIG. 9. As is known from FIG. 9, as compared with the case where the fillet length Y was set at 1.5 mm, the defective occurred after a longer temperature cycle when the fillet length Y was set at 2.0 mm. By setting the fillet length Y to be longer, reliability against film peeling of the chip edge by the TCT is enhanced.

Figure 10:
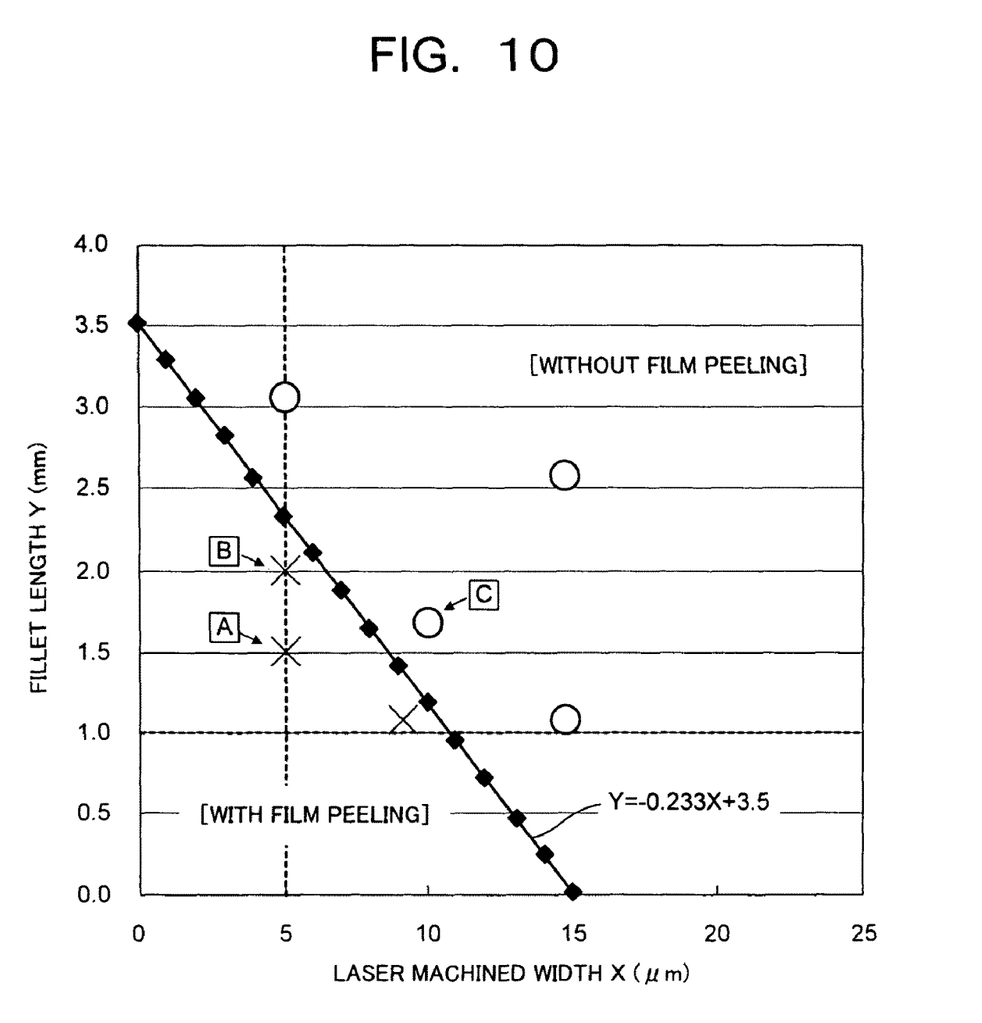
FIG. 10 is a diagram showing presence and absence of occurrence of film peeling based on a width X of a laser-machined groove and the fillet length Y of the underfill material.
Figure 11:
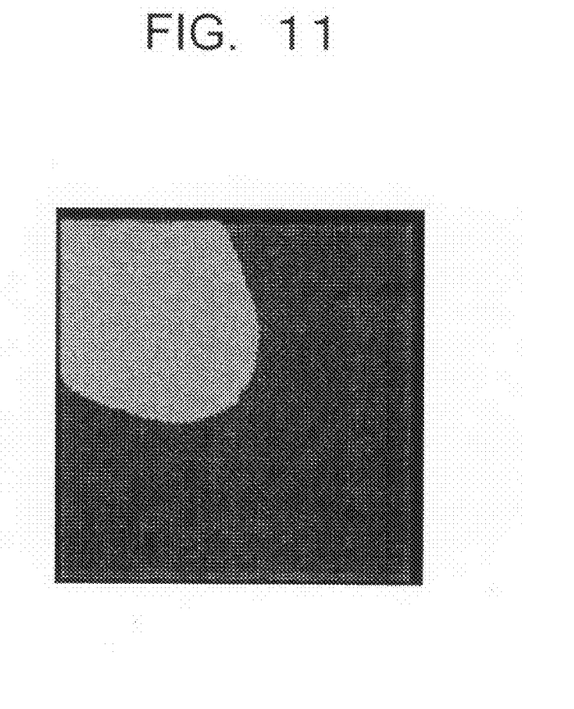
FIG. 11 is an image showing a result of observing the state of film peeling of the semiconductor element after the TCT in the semiconductor device to which the condition of a point A in FIG. 10 is applied with ultrasonic flaw detection.
Figure 12:
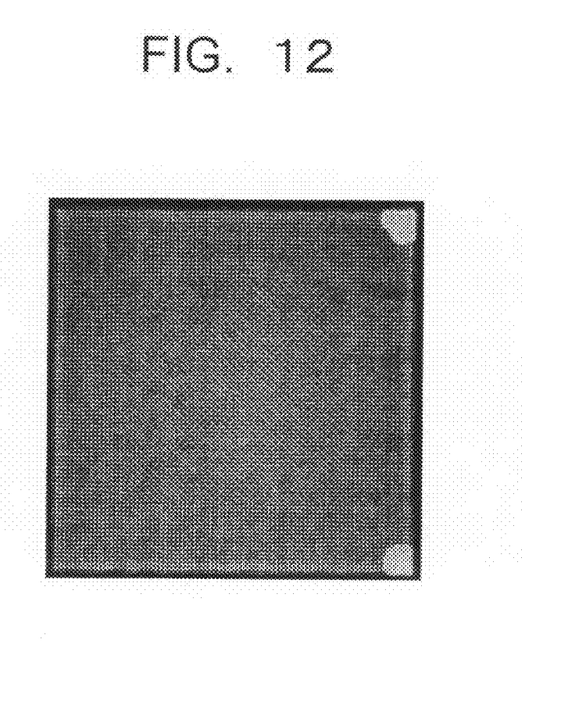
FIG. 12 is an image showing a result of observing the state of film peeling of the semiconductor element after the TCT in the semiconductor device to which the condition of a point B in FIG. 10 is applied with ultrasonic flaw detection.
Figure 13:
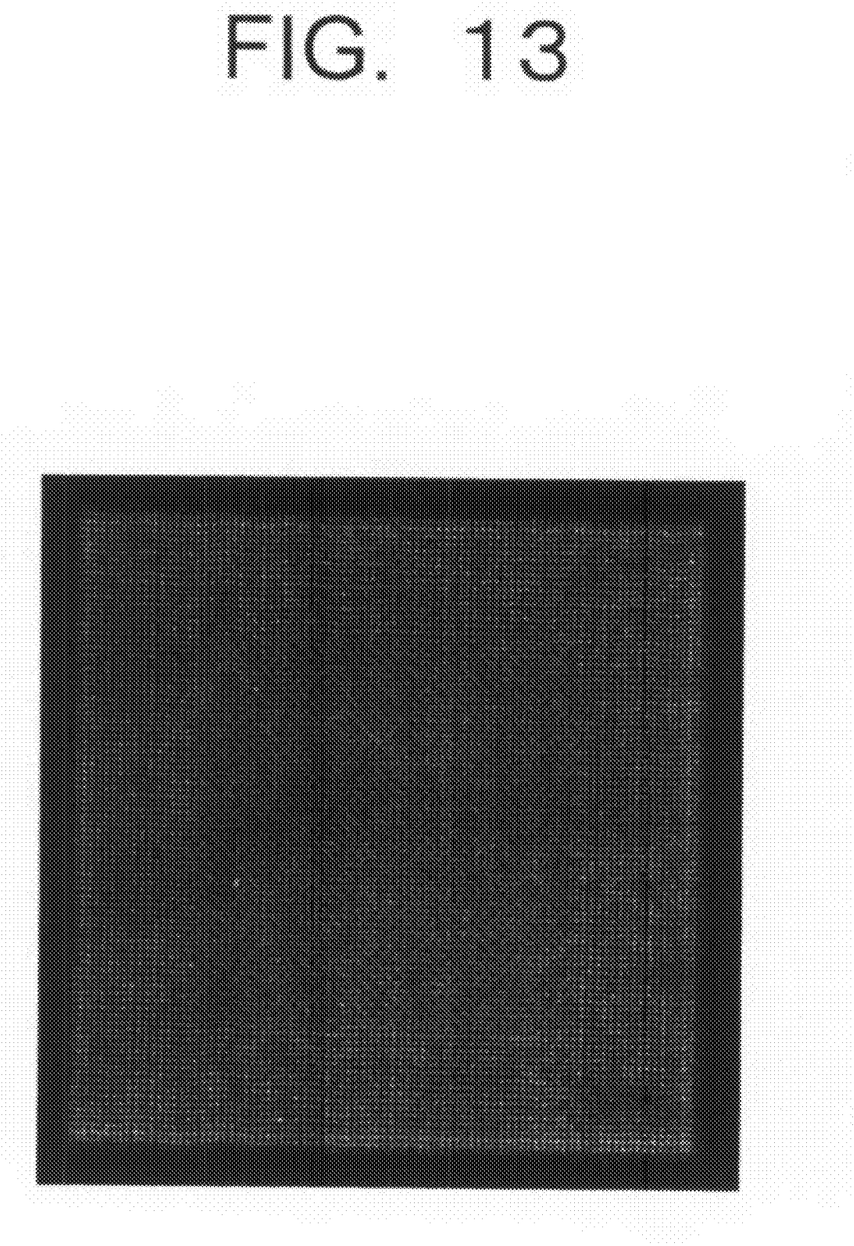
FIG. 13 is an image showing the result of observing the state of film peeling of the semiconductor element after the TCT in the semiconductor device to which the condition of a point C in FIG. 10 is applied with ultrasonic flaw detection.
Figure 14:
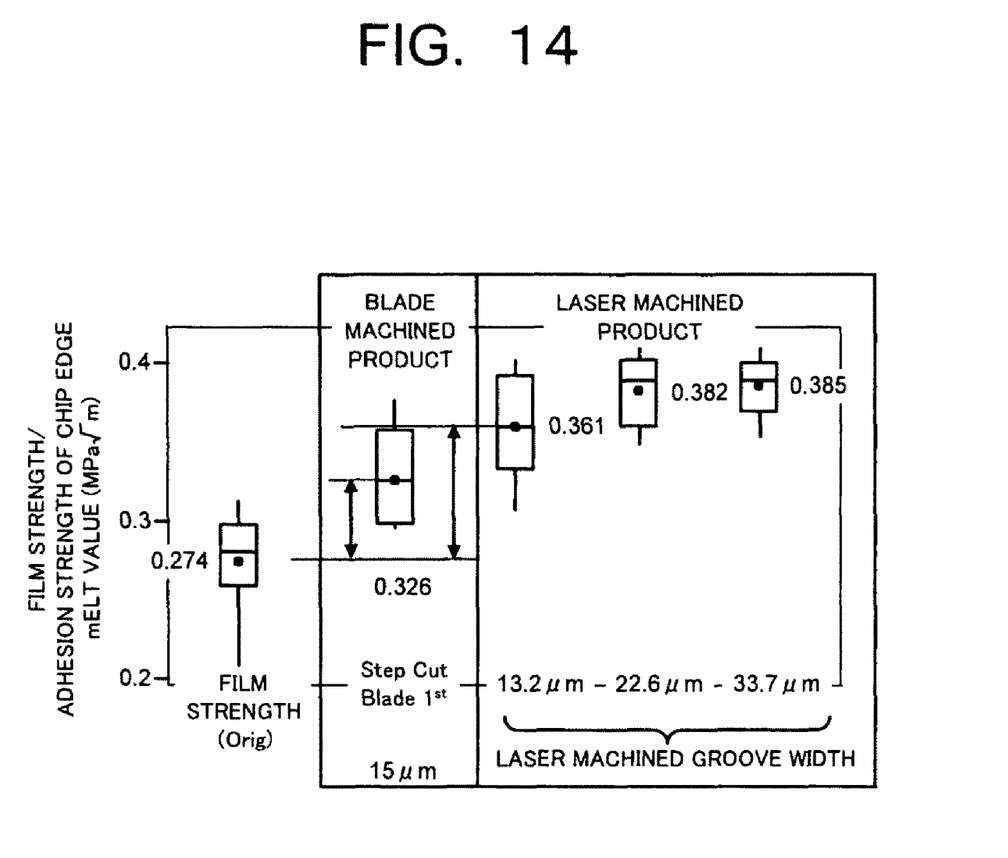
FIG. 14 is a diagram showing the relationship between a dicing method of the semiconductor element and adhesion strength of the laminated film.

Based on this point, the result of checking the presence or absence of a film peeling defective after the TCT when the width X of the laser-machined groove 20 and the fillet length Y of the underfill material 5 were changed is shown in FIG. 10. The semiconductor element 2 with the outer shape of 14×14 mm was used, and presence or absence of occurrence of film peeling defective after the TCT with 1000 cycles was checked. In FIG. 10, the crosses represent the products to which film peeling of the chip edge occurred after the TCT with 1000 cycles, whereas the circles represent the products to which film peeling of the chip edge did not occur after the TCT with 1000 cycles. As the concrete examples, FIGS. 11 to 13 show the result of checking the presence or absence of occurrence of film peeling under the various kinds of conditions. FIGS. 11 to 13 show the analytic images by scanning acoustic tomograph (SAT).

FIG. 11 shows the observation result of the semiconductor package with the condition of the point A in FIG. 10 (the groove width X: 5 μm, the fillet length Y: 1.5 mm) after the TCT with 1000 cycles. FIG. 12 shows the observation result of the semiconductor package with the condition of the point B in FIG. 10 (the groove width X: 5 μm, the fillet length Y: 2 mm) after the TCT with 1000 cycles. FIG. 13 shows the observation result of the semiconductor package with the condition of the point C in FIG. 10 (the groove width X: 10 μm, the fillet length Y: 1.5 mm) after the TCT with 1000 cycles. In these drawings, the portions which look white are the portions where film peeling occurred. Whereas under the conditions of the point A and the point B in FIG. 10, film peeling occurred, film peeling did not occur under the condition of the point C.

With respect to the conditions other than the points A, B and C, the TCT was conducted for the semiconductor packages with the groove width X and the fillet length Y changed, and it was checked whether or not film peeling occurred after 1000 cycles. The result shows that in the semiconductor packages 1 with selection of the conditions within the area in which the fillet length Y with respect to the groove width X is set to be longer than the line of [Y=−0.233X+3.5] in FIG. 10, occurrence of film peeling can be suppressed after the TCT with 1000 cycles. By setting the fillet length Y of the underfill material 5 to be long, and by setting the width X of the laser-machined groove 20 to be wide, reliability of the semiconductor package 1 for the TCT (reliability against the film peeling of the chip edge) can be enhanced.

When a TCT is conducted for the semiconductor package 1 of the FC-BGA structure, deformation due to thermal stress occurs to the semiconductor package 1 based on the difference of the thermal expansion coefficients of the semiconductor element 2 and the lid 22, the difference of thermal expansion coefficients of the semiconductor element 2 and the wiring substrate 3 and the like. The stress based on the deformation is applied to the end portion (chip edge) of the semiconductor element 2 which is connected to the wiring substrate 3. By the stress applied to the chip edge, film peeling occurs to the laminated film 7 of the semiconductor element 2. Especially, because the low dielectric constant insulating film 13 has low film strength of itself and low adhesion strength to the other materials, film peeling easily occurs when the stress is applied to the chip edge.

For film peeling due to thermal stress at the time of a TCT, the fixing force of the chip edge is increased and stress is relieved by making the fillet length Y of the underfill material 5 long. Accordingly, film peeling of the laminated film 7 due to the TCT can be suppressed. As described above, the fillet length Y is preferably set to be 1 mm or more to make the filling state of the underfill material 5 uniform. Further, in suppressing the film peeling of the laminated film 7 with favorable repeatability, the fillet length Y is preferably set to be 1.5 mm or more.

As the fillet length Y of the underfill material 5 is made longer, reliability against a TCT is enhanced (margin against occurrence of film peeling increases), but since other components may be loaded near the semiconductor element 2 depending on a package design, the fillet length Y is restricted. In consideration of the restriction by design, the fillet length Y is preferably set at 5 mm or less, more preferably 3.5 mm or less.

For relieving the stress applied to the chip edge during TCT, the fillet length Y and the laser-machined groove 20 provided along the outer periphery of the semiconductor element 2 effectively function. Specifically, the laser-machined groove 20 suppresses film peeling of the laminated film 7 at the time of dicing, and remains as an empty groove in the outer peripheral portion of the semiconductor element 2 after being segmented. When the semiconductor element 2 having such a laser-machined groove 20 is applied to the semiconductor package 1 of the FC-BGA structure, the underfill material 5 is also filled into the laser-machined groove 20 when the underfill material 5 is filled between the semiconductor element 2 and the wiring substrate 3.

The underfill material 5 filled in the laser-machined groove 20 functions as the fixing material for the end surface of the laminated film 7. By increasing the width X of the laser-machined groove 20, the fixing force of the end surface of the laminated film 7 by the underfill material 5 increases. Accordingly, film peeling of the laminated film 7 due to a TCT can be suppressed. Even when the fillet length Y of the underfill material 5 cannot be sufficiently made long, film peeling of the laminated film 7 due to TCT can be suppressed with favorable repeatability by increasing the width X of the laser-machined groove 20.

In more reliably increasing the fixing strength of the end surface of the laminated film 7 by the underfill material 5 which is filled in the laser-machined groove 20, the width X of the laser-machined groove 20 is preferably set at 5 μm or more. However, if the width of the laser-machined groove 20 is made too wide, increase or the like of the dicing region of the semiconductor element 2 is caused, and therefore, the width X of the laser-machined groove 20 is preferably set at 40 μm or less, more preferably at 20 μm or less. Even when the width X of the laser-machined groove 20 cannot be sufficiently large, film peeling of the laminated film 7 by a TCT can be suppressed with favorable repeatability by making the fillet length Y of the underfill material 5 long.

As described above, the fillet length Y of the underfill material 5 and the width X of the laser-machined groove 20 are respectively restricted, but by increasing the fixing force of the end portion of the laminated film 7 based on the constitutions of both of them, film peeling of the laminated film 7 based on the mounting structure of the semiconductor element 2 can be suppressed with favorable repeatability. By selecting the conditions in which the fillet length Y with respect to the width X of the laser-machined groove 20 is made longer than the line of [Y=−0.233X+3.5] in FIG. 10, film peeling of the laminated film 7 after TCT can be suppressed without greatly changing the design conditions of the semiconductor package 1 and the semiconductor element 2 from the conventional package structure.

FIG. 12 shows the result of evaluating the adhesiveness of the film to the chip edge by an m-ELT method (modified-Edge Lift off Test). Them-ELT method is the evaluation method which calculates the fracture energy which causes film peeling. First, an epoxy resin with a known thermal property is coated on the test film as a measurement sample and cured. By contracting the epoxy resin by lowering the temperature of the sample, peeling stress is applied to the end portion of the test film. The remaining stress of the epoxy resin is obtained from the temperature at which peeling occurs at the end portion of the test film, and from the remaining stress, the fracture energy (adhesion strength) of the test film is calculated.

As is known from FIG. 12, the strength of the film single body is 0.274 MPa·m$^{1/2}$, whereas the adhesion strength of the film at the chip edge when laser machined is increased by 30% or more to be 0.361 MPa·m$^{1/2}$ when the laser machined width is 13.2 μm. For reference, the adhesion strength when step cut is performed with a blade is shown. In this case, the effect of increasing strength is smaller as compared with the case of applying laser machining. Further, as the machined width by laser becomes larger, adhesion of the chip edge is improved. This corresponds to the effect by the laser machined width.

As described above, by applying the structure and manufacturing process in which the width X (μm) of the laser-machined groove 20 of the semiconductor element 2 and the fillet length Y (mm) of the underfill material 5 satisfy the condition of Y>−0.233X+3.5 (where X>0, and Y>0), film peeling of the laminated film 7 based on the mounting structure of the semiconductor element 2 (FC-BGA structure) can be suppressed with favorable repeatability. The manufacturing yield, reliability of the semiconductor package 1 in which the semiconductor element 2 having the laminated film 7 including the low dielectric constant insulating film 13 is connected on the wiring substrate 3 can be significantly enhanced. The semiconductor package (semiconductor device) 1 of the FC-BGA structure excellent in reliability can be produced with high yield.

The present invention is not limited to the above described embodiment, but the present invention can be applied to semiconductor devices having various kinds of structures and their manufacturing methods, and manufacturing methods of semiconductor devices having various kinds of process steps. Such semiconductor devices and their manufacturing methods are considered to be included in the present invention. The embodiment of the present invention can be expanded or changed within the scope of the technical idea of the present invention, and the extended and changed embodiments are considered to be included in the technical scope of the present invention.

What is claimed is:

1. A semiconductor device, comprising:
   a semiconductor element comprising a semiconductor substrate having an element region, a laminated film formed on the semiconductor substrate and including a low dielectric constant insulating film, and a laser-machined groove provided to enclose the element region, cutting at least the low dielectric constant insulating film of the laminated film, and having a width X (μm);
   a wiring substrate connected to the semiconductor element via a bump electrode; and
   an underfill material filled in an entire space between the semiconductor element and the wiring substrate except for an area that the bump electrode occupies, and having a fillet shape with a fillet length Y (mm),
   wherein the width X (μm) of the laser-machined groove and the fillet length Y (mm) of the underfill material satisfy conditions of X=5 to 15 μm, Y=1 to 3.5 mm, and Y>−0.233X+3.5.

2. The semiconductor device according to claim 1, further comprising:
   a lid provided on the wiring substrate to seal the semiconductor element.

3. The semiconductor device according to claim 2, wherein the lid includes a vessel-shaped metallic material, and is joined to aback surface of the semiconductor element.

4. The semiconductor device according to claim 1, wherein the low dielectric constant insulating film has a relative dielectric constant of 3.3 or less.

5. The semiconductor device according to claim 1,
   wherein the laminated film has a Cu wiring, and the low dielectric constant insulating film functioning as an interlayer insulating film of the Cu wiring.

6. The semiconductor device according to claim 1, wherein the laser-machined groove is formed to cut an entire thickness of the laminated film.

7. The semiconductor device according to claim 1,
   wherein the underfill material comprises a resin material having a Young's modulus in a range of 5 to 15 GPa and a thermal expansion coefficient in a range of 20 to 40 ppm.

* * * * *